United States Patent [19]
Fischer et al.

[11] Patent Number: 5,760,730
[45] Date of Patent: Jun. 2, 1998

[54] METHOD AND SYSTEM FOR ANALOG-TO-DIGITAL SIGNAL CONVERSION WITH SIMULTANEOUS ANALOG SIGNAL COMPRESSION

[75] Inventors: Matthew J. Fischer, Mountain View; Eugen Gershon, San Jose, both of Calif.

[73] Assignee: Advanced Micro Devices, Inc., Sunnyvale, Calif.

[21] Appl. No.: 826,585

[22] Filed: Apr. 3, 1997

[51] Int. Cl.$^6$ ............................................. H03M 1/38
[52] U.S. Cl. ............................................. 341/161
[58] Field of Search ............................. 341/161, 163, 341/164, 165, 155

[56] References Cited

U.S. PATENT DOCUMENTS 3,842,413  10/1974  Lagarde .................... 341/163
5,023,490  6/1991   Gittinger .

Primary Examiner—Brian K. Young

[57] ABSTRACT

A circuit is provided to carry out conversion and an analog signal into a digital signal, simultaneously with compression of the analog signal. An input analog signal buffered by a sample-and-hold circuit is supplied to a chain of amplifier stages having equal gains greater than 1. A set of comparators compares the output signal of each amplifier stage with a reference value. As soon as the output of any amplifier stage exceeds the reference value, an output of the corresponding comparator becomes active indicating the number of amplifier stages that were required to make the input signal higher than the reference value. A digital output device uses the comparator output signals to produce a digital signal proportional to the input signal level. As the amplifier chain is arranged so as to increase its total gain for a lower level of the input analog signal with respect to its total gain for a higher level of the input analog signal, the conversion circuit compresses the input analog signal simultaneously with its conversion into the digital signal.

17 Claims, 3 Drawing Sheets

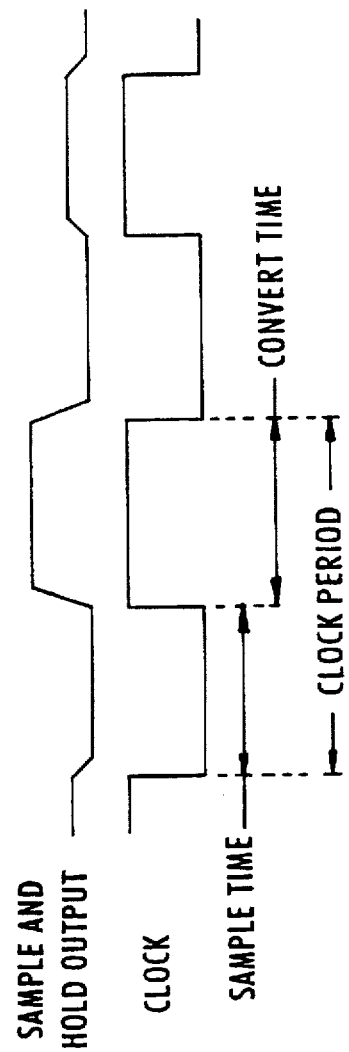
TYPICAL WAVEFORMS
Figure 2A — ANALOG INPUT
Figure 2B — SAMPLE AND HOLD OUTPUT
Figure 2C — CLOCK, SAMPLE TIME, CONVERT TIME, CLOCK PERIOD

METHOD AND SYSTEM FOR ANALOG-TO-DIGITAL SIGNAL CONVERSION WITH SIMULTANEOUS ANALOG SIGNAL COMPRESSION

TECHNICAL FIELD

The present invention relates to analog signal measurement and, more particularly, to a system that translates an input analog signal into a digital signal, and simultaneously compresses the input signal.

BACKGROUND ART

For such applications as communication equipment, and electronic instruments, input signals are usually presented as analog waveforms. However, most modern control systems and signal processing subsystems are built on digital circuitry or are implemented in software run by digital processors. Therefore, input analog signals must be converted into digital signals to allow complex signal analysis and processing to be carried out. To prevent weak signal components from being lost in the background and strong signal components from overloading the signal processing system, an analog signal may be compressed before its conversion into a digital signal.

Various compression schemes have been developed to compress an analog signal before its conversion. For example, U.S. Pat. No. 5,023,490 to Gittinger of Jun. 11, 1991 discloses a circuit for performing a monotonic compression function over an AC signal before supplying the AC signal to a high-frequency analog-to-digital converter. The compression circuit comprises multiple limiter stages, each of which contains a wide-band cascode amplifier and current-mirror devices. Thus, the prior art arrangement requires separate circuits for carrying out analog signal compression and conversion procedures.

To reduce the number of components required to perform analog signal compression and conversion, it would be desirable to provide a single circuit that combines analog-to-digital signal conversion with analog signal compression.

Also, to increase operating speed of a signal processing system, it would be desirable to provide a circuit that carries out the conversion at an analog signal into a digital signal and the compression of the analog signal in a single step.

DISCLOSURE OF THE INVENTION

Accordingly, one advantage of the invention is in providing a single circuit that combines the conversion of an analog signal into a pulse signal with the compression of the analog signal.

Another advantage of the invention is in providing a circuit that carries out the conversion of an analog signal into a pulse signal and the compression of the analog signal in a single step.

The above and other advantages of the invention are achieved, at least in part, by providing a circuit for converting an input analog signal into a digital signal, that comprises an amplifier having a plurality of amplifier stages responsive Lo the input analog signal.

A comparator is coupled to outputs of the amplifier stages for comparing an output signal of each of the amplifier stages with a preset reference value. An output device is coupled to outputs of the comparator or producing the digital signal when the output signal or any of the amplifier stages exceeds the preset reference value. The amplifier stages are arranged so as to increase a gain of the amplifier for a lower level of the input analog signal with respect to the gain for a higher level of the input analog signal, to provide compression of the input analog signal.

In accordance with one aspect of the present invention, the amplifier stages are connected in series and have an equal gain greater than 1.

In accordance with another aspect of the invention, a sample-and-hold circuit is coupled to an input of the amplifier. The sample-and-hold circuit Is controlled by a control signal to produce a sample-and-hold signal at a low level in a sample time period, and to produce the sample-and-hold signal corresponding to the input analog signal in a convert time period. The amplifier stages are arranged to sequentially amplify the sample-and-hold signal.

In accordance with a further aspect of the invention, the output device may comprise an output register that receives output signals of the comparator to produce a digital value corresponding to the input analog signal and having the number of bits equal to the number of the amplifier stages. A conversion device may be coupled to the output register for converting the digital value in a digital word composed of a desired number of bits.

For example, the conversion device may comprise a memory for storing look-up values indicating digital words that correspond to various levels of the input signal. A plurality of gates may be connected between the output register and the memory for reading the look-up value corresponding to the digital value contained in the register. The gates may be arranged so as to provide an active output signal only at one of their outputs.

The look-up values may be stored in a ROM or a RAM. If a RAM is used, the look-up values may be programmed using a known input calibration signal supplied to the amplifier stages.

Alternatively, the output device may comprise a counter that receives output signals of the comparator to produce the digital signal.

In accordance with a method of the present invention, the following steps are carried out:

supplying the analog signal to an amplifier composed of multiple amplifier stages arranged to provide sequential amplification of the analog signal, producing the digital signal when an output signal of any of the amplifier stages exceeds a preset reference value, and arranging the amplifier so as to increase its gain for a lower level of the input analog signal with respect to the gain for a higher level of the input analog signal, to provide compression of the input analog signal.

To calibrate the analog-to-digital converter, a known calibration signal may be supplied to the amplifier to produce a calibration digital value compared with an expected value. The digital signal may be adjusted if a difference between the calibration digital value and the expected value is detected.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIGS. 2A–2C are waveform diagrams that illustrate operations of the converter in FIG. 1.

BEST MODE FOR CARRYING OUT THE INVENTION

Although the invention has general applicability in the field of analog signal processing, the best mode for practicing the invention is based in part on the realization of a converter that translates input analog signals into digital signals.

Figure 1:
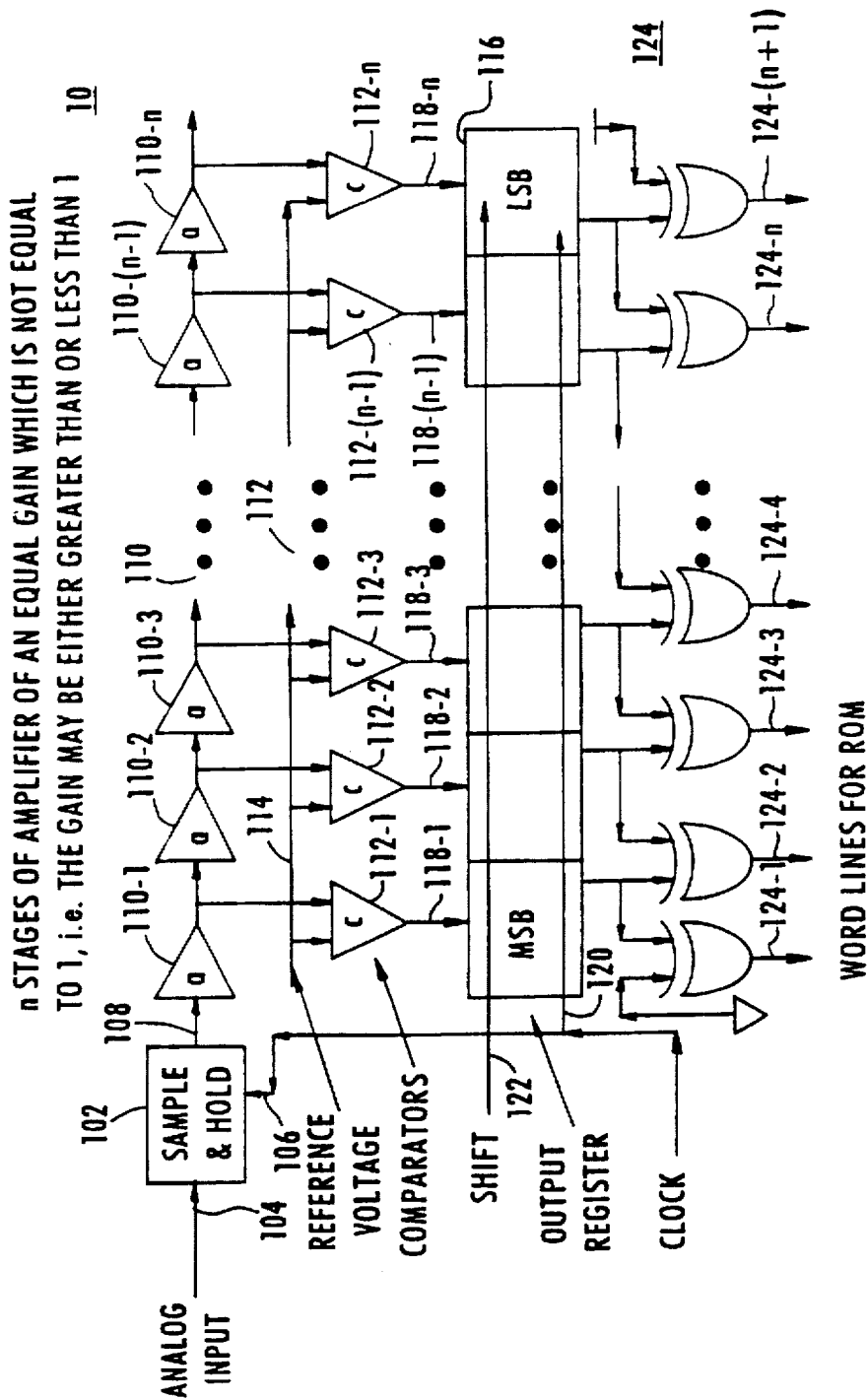
FIG. 1 is a diagram of an analog-to-digital converter according to a first embodiment of the present invention.

Referring to FIG. 1, an analog-to-digital signal converter 10 comprises a sample-and-hold circuit 102 having an input 104 supplied with an analog signal to be converted into a digital signal. The sample-and-hold circuit 102 is supplied with an external clock signal via its control input 106 to produce a sample-and-hold output signal at its output 108. An amplifier chain 110 composed of n amplifier stages 110-1, 110-2, .... 110-n is connected to the output 108. The amplifier stages in the chain 110 have equal gains that may be greater than 1 or less than 1. Each of the amplifier stages 110-1, 110-2, .... 110-(n−1) has its output coupled to the input of the next amplifier stage.

The amplifier chain 110 is coupled to a set 112 of comparators 112-1, 112-2, ...., 112-n. One input of each comparator 112-1, 112-2, ...., 112-n is connected to the output of the amplifier stages 110-1, 110-2, .... ,110-n, respectively. Via a reference voltage line 114, another input of each comparator is supplied with a reference voltage provided by an external reference voltage source.

An output register 116 has a parallel data input composed of data inputs 118-1, 118-2, ...., 118-n respectively connected to outputs of the comparators 112-1, 112-2, ...., 112-n. The output register 116 contains the number of bits equal to the number of the amplifier stages in the amplifier chain 110. The most significant bit (MSB) of the register 116 is provided by the first comparator 112-1 coupled to the first amplifier stage 110-1, and the least significant bit (LSB) is supplied by the last comparator 112-n coupled to the last amplifier stage 110-n. A clock input 120 of the register 116 is supplied with the external clock signal. A shift input 122 of the register 116 is provided with a shift signal which may be supplied by an external calibration circuit to adjust the analog-to-digital converter 10.

A "leading one" detector 124 composed of XOR gates 124-1, 124-2, ...., 124-(n+1) is coupled to the output register 116. Each intermediate XOR gate 124-i (n+1>i>1) is arranged to provide XOR operation under adjacent bits of the output register 116. In particular, the XOR gate 124-2 is arranged to receive the first bit (MSB) and the second bit of the register 116. The XOR gate 124-3 receives the second and third bits, etc. Finally, the XOR gate 124-n receives the (n−1)-th and n-th bits from the register 116.

The first XOR gate 124-1 has its first input supplied with a logical 0, and its second input coupled to receive the first bit. The last XOR gate 124-(n+1) has its first input coupled to receive the n-th bit (LSB) from the register 116, and its second input supplied with a logical 1.

Outputs of the XOR gates 124-1, 124-2, ...., 124-(n+1) are connected to word lines of a ROM that stores a conversion look-up table used for reading an output digital value produced by the analog-to-digital converter 10. Alternatively, the conversion look-up table may be stored in a RAM.

The operation of the analog-to-digital converter 10 is as follows. Reference is now made to diagrams in FIGS. 2A–2C that show typical waveforms of signals in the analog-to-digital converter 10. Via the input 104, an analog input signal (FIG. 2A) is supplied to the sample-and-hold circuit 102 that produces a sample-and-hold output signal (FIG. 2B). A clock signal (FIG. 2C) supplied via the control input 106 controls the sample-and-hold circuit 102 so as to sample the analog input signal for a period of time defined by the characteristics of the sample-and-hold circuit 102.

As shown in FIGS. 2B and 2C, the output of the sample-and-hold circuit 102 is held at a zero level during the sample time period set by the clock signal. When the clock signal (FIG. 2C) goes high to switch the converter 10 from the sample time period to the convert time period, the sample-and-hold circuit 102 produces a buffered version of the input signal at its output (FIG. 2B).

The sample-and-hold output signal supplied via the output 108 to the amplifier chain 110 propagates through the amplifier stages 110-1, 110-2, ...., 110-n having an equal gain. To provide the compression of the analog input signal, the gain of the amplifier stages 110-1, 110-2, .... ,110-n should be greater than 1. However, analog-to-digital signal conversion may be carried out even when the gain of the amplifier stages is less than 1, provided that the comparator inputs are reversed.

As the signal propagates through the amplifier chain 110, the output signal of each amplifier stage 110-1, 110-2, ...., 100-n is respectively supplied to each of the comparators 112-1, 112-2, ...., 112-n which compares the corresponding output signal with a pre-established reference value. Each comparator 112-1 112-2, ...., 112-n may be supplied with the same reference value. Alternatively, the reference voltage supply line 114 may be arranged so as to provide the reference value at the subsequent comparator in the comparator set 112 less than the reference value at the preceding comparator. Thus, the reference value at the comparator 112-2 may be less than the reference value supplied to the preceding comparator 112-1. Similarly, the reference value at the next comparator 112-3 may be less than the reference value at the comparator 112-2, etc. Finally, the reference value at the comparator 112-n may be less than the reference value at the comparator 112-(n−1).

If the output signal at any amplifier stage 110-i exceeds the reference value supplied to the corresponding comparator 112-i, a logical 1 is produced at the output of the comparator 112-i indicating that the comparator 112-i becomes active. Alternatively, the comparator 112-i may be set to produce a logical 0 when the output signal of the amplifier stage 110-i exceeds the reference value supplied to the comparator 112-i.

The comparators 112-(i+1) to 112-n subsequent to the comparator 112-i that becomes active will also become active and produce logical 1's at their output.

When enough time has passed to allow the output sample-and-hold signal (FIG. 2B) to propagate through all of the amplifier stages in the chain 110, the clock signal (FIG. 2C) is switched to its low level to initiate a new sample time period in the sample-and-hold circuit 102. During the sample time period, the sample-and-hold circuit 102 is controlled to produce a zero level signal at its output (FIG. 23). Simultaneously, the clock signal is supplied to the output register 116 to latch the output values of the comparators 112 into the output register 116.

The output digital signal produced by the analog-to-digital converter 10 may be obtained by reading the output register 116. A digital value in the output register 116 contains the number of bits equal to the number n of the amplifier stages in the amplifier chain 110.

In a preferred embodiment of the present invention the number n may be much larger than the desired number of bits in the output digital signal. Also, the digital value in the output register 116 may be not linear. The conversion Hook-up table stored in a ROM may be used to obtain a linear output digital signal having the desired number of bits.

To carry out look-up conversion of the digital value contained in the output register 116, each of the intermediate XOR gates 124-2, 124-2, , 124-n of the leading one detector 124 performs XOR operations under the corresponding pair of adjacent bits in the output register 116. The first XOR gate 124-1 has its first input supplied with a logical 0, and its second input supplied with the MSB of the digital value in the output register 116. The last XOR gate 124-(n+1) has its first input supplied with the LSB of the digital value, and its second input supplied with a logical 1. Output signals of the XOR gates 124-1, 124-2, . . . , 124-(n+1) are supplied to word lines of the ROM storing the look-up table.

The arrangement of the XOR gates in the leading one detector 124 causes an active output signal, for example, a logical 1, to be produced only at one of the XOR gates 124-1 to 124-(n+1) for any conversion cycle. Accordingly, only one word line of the ROM will become active when the digital value is read from the output register 116.

The active word line causes the read of a single location in the ROM, which outputs a word that corresponds to a linearly-converted output digital signal.

The resolution of the analog-to-digital converter 10 varies depending on the number of amplifier stages through which the sample-and-hold signal must propagate until the first comparator of the comparator set 112 becomes active. The quantization step of the analog-to-digital conversion provided by the converter 10 increases as the sample-and-hold signal traverses the amplifier chain 110. When the gain of the amplifier stages in the chain 110 is greater than 1, an input signal having a smaller amplitude propagates through a larger number of the amplifier stages than an input signal with a higher amplitude. Thus, the resolution of the analog-to-digital converter 10 is greater for smaller input signals. Accordingly, the amplifier chain 110 is arranged so as to increase its total gain for a lower level of the input analog signal with respect to its total gain for a higher level of the input analog signal. Thus, the analog-to-digital converter 10 provides compression of an analog input signal simultaneously with its conversion into a digital signal. For example, the analog signal compression may prevent analog signal components having small amplitudes from being lost in background, and prevent analog signal components having high amplitudes from overloading a signal processing system.

As discussed above, to provide analog signal compression, the gains of the amplifier stages in the chain 110 are set to be equal with each other and greater than 1. Each comparator 112-1, 112-2, . . . , 112-n may be supplied with the same reference value.

Alternatively, the reference value at a comparator 112-i in the comparator set 112 may be made less than the reference value at the preceding comparator 112-(i−1)

In a preferred embodiment of the present invention, calibration adjustments may be made between the time of obtaining a digital value in the output register 116 and the time of reading the digital value using the leading one detector 124. The calibration adjustments involve a number of right- or left-shift operations under the digital value performed using the shift signal.

To provide the calibration, a known reference calibration analog signal is supplied to the input 104 of the analog-to-digital converter 10 at periodic intervals, for example, before the sample time period of each conversion cycle. A calibration digital output signal produced after the conversion of the reference calibration signal is compared to the expected digital output for the known signal. If a difference is detected, then a calibration adjustment is carried out for the next conversion cycle. A calibration offset register may be used to store a calibration adjustment value that indicates the number of right or left shifts required to be performed in the next conversion cycle. The calibration adjustment value corresponds to the difference between the calibration digital output and the expected digital output.

In particular, when an input analog signal is converted into a digital value entered into the output register 116, the calibration adjustment value may be used to control the shift signal supplied to the output register 116. As a result, the digital value contained in the output register 116 is shifted in left or right direction by the number of bits defined by the calibration adjustment value.

Thereafter, the corrected digital value is read by the leading one detector 124 from the output register 116 to obtain a resulting output digital signal from the look-up table.

If the look-up table is stored in a RAM, look-up values in the table may be modified in accordance with results of a calibration, for example, to accommodate changes In operating conditions. Accordingly, results of a calibration may be used to program a new set of look-up values in the look-up table.

Figure 3:
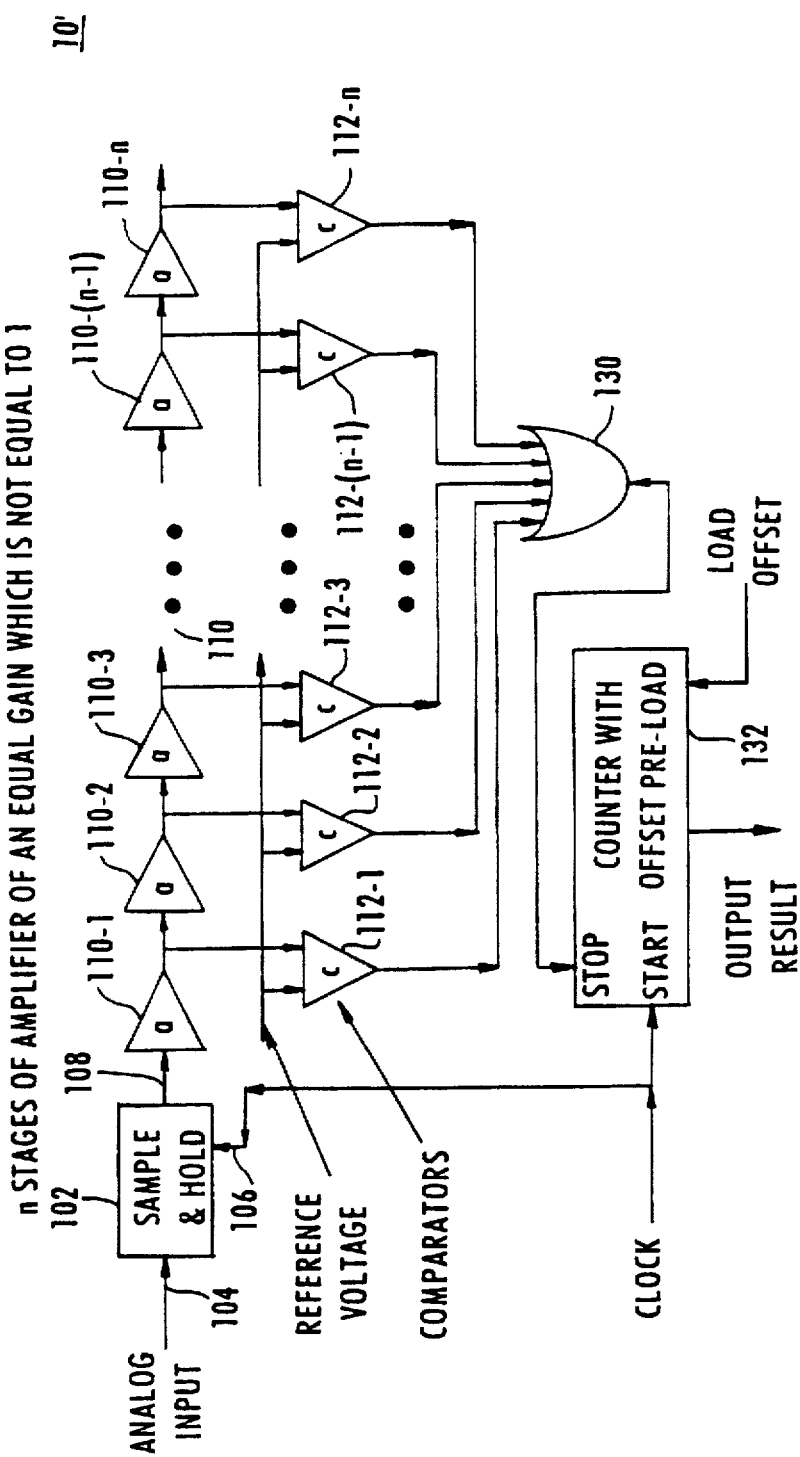
FIG. 3 is a diagram of an analog-to-digital converter according to a second embodiment of the present invention.

Reference is now made to FIG. 3 that illustrates an analog-to-digital converter 10' in accordance with another embodiment of the present invention. By contrast with the converter 10 shown in FIG. 1, the analog-to-digital converter 10' does not use the output register 116 and the leading one detector 124. Instead, the outputs of the comparators 112-1, 112-2, . . . , 112-n are coupled to inputs of an OR gate 130. The output of the OR gate 130 is connected to a stop input of a counter 132 with offset pre-load. A clock signal is supplied to the control input 106 of the sample-and-hold signal and to a start input of the counter 132.

The counter 132 is preloaded with a digital offset value supplied via its load offset input. Simultaneously with switching the sample-and-hold circuit 102 into the convert time mode to produce a buffered version of an input analog signal, the clock signal activates the start input of the counter 132 to start counting. As soon as an output of any one of the converters 112-1 to 112-n becomes active indicating that the input signal exceeds the reference voltage, the output of the OR gate 130 also becomes active. As a result, a stop input of the counter 132 is activated to stop counting. Thus, the counter 132 increments or decrements the preloaded offset value by an amount proportional to the time interval between the activation of the start input and the activation of the stop input. As this time interval corresponds to the amplitude of the input analog signal, a digital output signal produced at a result output of the counter 132 is proportional to the input signal level. The counter 132 may be calibrated using a known calibration analog signal supplied to the converter input 104 to establish the preloaded digital offset value.

There accordingly has been described a circuit that provides conversion of an analog signal into a digital signal, and simultaneous compression of the analog signal. An input analog signal buffered by a sample-and-hold circuit is supplied to a chain of amplifier stages having equal gains greater than 1. A set of comparators compares the output signal of each amplifier stage with a reference value. As soon as the output of any amplifier stage exceeds the reference value, an output of the corresponding comparator becomes active indicating the number of amplifier stages that were required to make the input signal higher than the reference value. A digital output device uses the comparator output signals to produce a digital signal proportional to the input signal level. As the amplifier chain is arranged so as to increase its total gain for a lower level of the input analog signal with respect to its total gain for a higher level of the input analog signal, the conversion circuit compresses the input analog signal simultaneously with its conversion into the digital signal.

In this disclosure, there are shown and described only the preferred embodiments of the invention, but it is to be understood that the invention is capable of changes and modifications within the scope of the inventive concept as expressed herein.

What is claimed is:

1. A circuit for converting an input analog signal into a digital signal, comprising:
   an amplifier having a plurality of amplifier stages responsive to said input analog signal,
   a sample-and-hold circuit coupled to an input of said amplifier and arranged to be controlled by a control signal to produce a sample-and-hold signal at a low level in a sample time period, and to produce the sample-and-hold signal corresponding to said input analog signal in a convert time period,
   a comparator coupled to outputs of said amplifier stages for comparing an output signal of each of said amplifier stages with at least one preset reference value, and
   an output device coupled to outputs of said comparator for producing said digital signal when the output signal of any of said amplifier stages exceeds said preset reference value,
   wherein said amplifier stages are arranged so as to increase a gain of said amplifier for a lower level of said input analog signal with respect to the gain for a higher level of said input analog signal, to provide compression of said input analog signal.

2. The circuit of claim 1, wherein said amplifier stages are connected in series.

3. The circuit of claim 2, wherein said amplifier stages have an equal gain.

4. The circuit of claim 3, wherein a gain of each of said amplifier stages is greater than 1.

5. A circuit for converting an input analog signal into a digital signal, comprising:
   an amplifier having a plurality of amplifier stages responsive to said input analog signal,
   a comparator coupled to outputs of said amplifier stages for comparing an output signal of each of said amplifier stages with at least one preset reference value, and
   an output device coupled to outputs of said comparator for producing said digital signal when the output signal of any of said amplifier stages exceeds said preset reference value,
   wherein said amplifier stages are arranged so as to increase a gain of said amplifier for a lower level of said input analog signal with respect to the gain for a higher level of said input analog signal, to provide compression of said input analog signal, and
   said output device comprises an output register arranged to receive output signals of said comparators to produce a digital value corresponding to said input analog signal and having the number of bits equal to the number of said amplifier stages.

6. The circuit of claim 5, wherein said output device further comprises a conversion device for converting said digital value in a digital word composed of a desired number of bits.

7. The circuit of claim 6, wherein said conversion device comprises a memory for storing a look-up value indicating said digital word.

8. The circuit of claim 7, wherein said conversion device further comprises a plurality of gates having outputs coupled to said memory for reading said look-up value from said memory.

9. The circuits of claim 8, wherein said plurality of gates are arranged so as to provide an active output signal only at one of the outputs of the plurality of gates.

10. The circuit of claim 9, wherein said memory comprises a ROM for storing said look-up value.

11. The circuit of claim 9, wherein said memory comprises a RAM for storing said look-up value.

12. The circuit of claim 11, wherein said look-up value is programmed using a known input calibration signal supplied to said amplifier stages.

13. The circuit of claim 5, wherein said output register is arranged to receive a signal for shifting said digital value to provide a calibration adjustment of said converting circuit.

14. The circuit of claim 1, wherein said output device comprises a counter arranged to receive output signals of said comparator to produce said digital signal.

15. A method of converting an analog signal into a digital signal, comprising the steps of:
   supplying the analog signal to an amplifier composed of multiple amplifier stages arranged to provide sequential amplification of the analog signal,
   producing the digital signal when an output signal of any of the amplifier stages exceeds a preset reference value,
   arranging said amplifier so as to increase its gain for a lower level of said input analog signal with respect to the gain for a higher level of said input analog signal, to provide compression of said input analog signal, and
   supplying said amplifier with a known calibration signal to produce a calibration digital value.

16. The method of claim 15, further comprising the step of comparing said calibration digital value with an expected value.

17. The method of claim 16, further comprising the step of adjusting said digital signal if a difference between said calibration digital value and said expected value is detected.

* * * * *